United States Patent
Wong et al.

(10) Patent No.: US 6,358,670 B1
(45) Date of Patent: Mar. 19, 2002

(54) ENHANCEMENT OF PHOTORESIST PLASMA ETCH RESISTANCE VIA ELECTRON BEAM SURFACE CURE

(75) Inventors: Selmer Wong, San Diego; Matthew Ross, La Jolla, both of CA (US)

(73) Assignee: Electron Vision Corporation, San Diego, CA (US)

( * ) Notice: Subject to any disclaimer, the term of this patent is extended or adjusted under 35 U.S.C. 154(b) by 0 days.

(21) Appl. No.: 09/473,373

(22) Filed: Dec. 28, 1999

(51) Int. Cl.⁷ .................................................. G03C 5/00
(52) U.S. Cl. ........................ 430/296; 430/313; 430/328; 430/942
(58) Field of Search ................................. 430/296, 313, 430/328, 942

(56) References Cited

U.S. PATENT DOCUMENTS

| | | | |
|---|---|---|---|
| 4,904,866 A | 2/1990 | Collins et al. | 250/492.2 |
| 5,003,178 A | 3/1991 | Livesay | 250/492.3 |
| 5,468,595 A | 11/1995 | Livesay | 430/296 |
| 6,080,526 A * | 6/2000 | Yang et al. | 430/296 |

FOREIGN PATENT DOCUMENTS

| EP | 0 986 072 A2 | 3/2000 |
|---|---|---|
| WO | WO 98/43294 | 10/1998 |

OTHER PUBLICATIONS

IBM Technical Disclosure Bulletin, XP–00214641, Single–Layer Photoresist Profiling, H. Bohlen, J. Greschner and H.J. Trumpp, vol. 23, No. 8, Jan. 1981.

IBM Technical Disclosure Bulletin, XP–000083367, Resist Hardening by E–Beam Irradiation, vol. 32, No. 10A, Mar. 1990.

XP–000985713, Electron Beam Hardening of Photoresist, W.R. Livesay, A.L. Rubiales, M. Ross, S. Woods, S. Campbell, Electron Vision Corporation, San Diego, CA 92126.

W.R. Livesay "Vertical Lithography—Controlling Resist Profiles in Optical Lithography With a Large Area Electron Beam" SPIE Microlithography 1994 Conference.

* cited by examiner

Primary Examiner—Christopher G. Young
(74) Attorney, Agent, or Firm—Roberts & Mercanti LLP

(57) ABSTRACT

A process for increasing the etch resistance of the upper surface of photoresists by a surface-intensive dose of electron beam radiation. Such imparts increased surface etch resistance to the photoresist without causing as much shrinkage in the bulk of the film. A photographic image is produced by imagewise exposing a photographic composition layer on a substrate to activating energy to produce a latent pattern on the layer. This is followed by developing the photographic layer to thereby remove the nonimage areas thereof and leaving the image areas thereof in the form of a pattern on the substrate. The imaged layer is then overall irradiated to electron beam radiation for the full depth of the layer and then overall irradiated to electron beam radiation one or more additional times at a depth which is less than the full depth of the layer.

28 Claims, No Drawings

ENHANCEMENT OF PHOTORESIST PLASMA ETCH RESISTANCE VIA ELECTRON BEAM SURFACE CURE

BACKGROUND OF THE INVENTION

1. Field of the Invention

The present invention relates to a process for increasing the etch resistance of photoresists which are suitable for use in the production of microelectronic devices such as integrated circuits. More particularly, the invention provides a process for increasing the etch resistance of the upper surface of photoresists by a surface-intensive dose of electron beam radiation. Such imparts increased surface etch resistance to the photoresist without causing as much shrinkage in the bulk of the film as a uniform electron beam irradiation dose.

2. Description of the Related Art

The art of forming images for the production of microelectronic devices is well known. In this regard, photoresist compositions are widely used image-forming compositions for microelectronic device manufacturing processes. Generally, in these processes a thin coating of a radiation sensitive photoresist composition is first applied to a substrate material. The coated substrate is then treated to evaporate any solvent in the photoresist composition and to fix the coating onto the substrate. The coated surface of the substrate is next subjected to an imagewise exposure to actinic radiation. This radiation exposure causes a chemical transformation in the exposed areas of the coated surface. After imagewise exposure, the coated substrate is contacted with a developer solution to dissolve and remove either the radiation-exposed or the unexposed areas of the coated surface of the substrate.

The production of positive photoresists is well known in the art as shown in U.S. Pat. Nos. 3,666,473; 4,115,128 and 4,173,470. Photoresists are either positive working or negative working. In a negative working resist composition, the imagewise light struck areas harden and form the image areas of the resist after removal of the unexposed areas with a developer. In a positive working resist the exposed areas are the non-image areas. The light struck parts are rendered soluble in aqueous alkali developers. The ability to reproduce very small dimensions, is extremely important in the production of large scale integrated circuits on silicon chips and similar components. As the integration degree of semiconductor devices becomes higher, finer photoresist film patterns are required. Positive photoresists have been found to be capable of much higher resolution and have almost universally replaced negative resists for this purpose. Positive working resists often contain aqueous alkali soluble polyvinyl phenol or phenol formaldehyde novolak resins together with light sensitive materials, usually a substituted naphthoquinone diazide compound. The resins and sensitizers are dissolved in an organic solvent and are applied as a thin film coating to a substrate suitable for the particular application desired. The resin component of photoresist formulations is soluble in an aqueous alkaline solution, but the photosensitizer is not. Upon imagewise exposure of the coated substrate to actinic radiation, the exposed areas of the coating are rendered more soluble than the unexposed areas. This difference in solubility rates causes the exposed areas of the photoresist coating to be dissolved when the substrate is immersed in an alkaline developing solution, while the unexposed areas are substantially unaffected, thus producing a positive image on the substrate.

The uncovered substrate is thereafter subjected to an etching process.

Frequently, this involves a plasma etching against which the resist coating must be sufficiently stable. The photoresist coating protects the covered areas of the substrate from the etchant and thus the etchant is only able to etch the uncovered areas of the substrate. Thus, a pattern can be created on the substrate which corresponds to the pattern of the mask or template that was used to create selective exposure patterns on the coated substrate prior to development.

Chemical amplification resist films have been developed, which have been found to have superior resolution. 248 nm and 193 nm photoresists are based on chemically amplified deprotection. With this mechanism, a molecule of photogenerated acid catalyzes the breaking of bonds in a protecting group of a polymer. During the deprotecting process, another molecule of the same acid is created as a byproduct, and continues the acid-catalytic deprotection cycle. The chemistry of a 193 mn photoresist is based on polymers such as, but not limited to, acrylates, cyclic olefins with alicyclic groups, and hybrids of the aforementioned polymers which lack aromatic rings, which contribute to opacity at 193 nm. It has thus been known to utilize photoresists based on methacrylate resins for the production of microstructures by means of 193 nm radiation. However, chemically amplified resist films have not played a significant role in the fine pattern process using deep UV because they lack sufficient etch resistance, thermal stability, post exposure delay stability and processing latitude. A typical chemical amplification photoresist film comprises a polymer, a photoacid generator, and other optional additives. The polymer is required to be soluble in the chosen developer solution, and have high thermal stability and low absorbance to the exposure wavelength in addition to having excellent etch resistance.

It would be desirable to overcome the etch resistance problems and to provide a photoresist film superior in etch resistance. There have been several attempts to solve this problem. One attempt to improve the etching resistance proposes to treat the substrate having a finished, developed, image-structured photoresist coating with specific alkyl compounds of magnesium or aluminum, in order to introduce the given metals in the resist material as etching barriers (See U.S. Pat. No. 4,690,838). The use of metal-containing reagents, however, is generally not desired in microlithography process, due to the danger associated with contamination of the substrate with metal ions.

It has been determined that the etch resistance of imagewise exposed and developed photoresists may be increased by an overall flood exposure with an electron beam. One proposal has been to irradiate an exposed and developed photoresist with a uniform electron dose prior to plasma etch processing. However, this has been determined to cause excess shrinkage in the bulk of the film. It has been determined, that the etch resistance of imagewise exposed and developed photoresists can be enhanced using a non-uniform, surface-intensive dose of electrons. This non-uniform dose, or surface cure treatment imparts etch resistance to the surface of the photoresist without causing as much film shrinkage as a uniform dose. This reduced shrinkage is particularly desirable in the advanced lithography resists which can shrink up to 35% of their original thickness during e-beam processing.

The surface cure via flood electron beam treatment uses a non-uniform dose distribution as a function of photoresist depth. The electrons initiate crosslinking in the resists, making the resists more mechanically robust and thus more etch resistant. By delivering fewer electrons to the bulk of the resist layer and more electrons to the surface (e.g., about the top third of the thickness), the surface is preferentially more crosslinked than the bulk of the resist, resulting in a hardened "shell" of resist. This hardened shell is able to maintain the photoresist dimensions during a plasm etch process.

In general, a photosensitive resist is applied to a substrate, imagewise exposed to actinic radiation, and developed in a developer solution to create the desired pattern of resist. The patterned resist is then overall flood exposed to a large area electron source, at dose levels which can range from 5 $\mu C/cm^2$ to 50,000 $\mu C/cm^2$. In this manner, a resist image is now sufficiently stable to permit plasma etching. In this way, a photoresist image is provided with an enhanced etch resistance rate without needing to treat the resist coating with metal compounds.

SUMMARY OF THE INVENTION

The invention provides a process for producing a photographic image which comprises:

(a) imagewise exposing a photographic composition layer on a substrate to sufficient activating energy to produce a latent pattern on the photographic composition layer; which photographic composition layer has a full depth extending from a top surface of the layer to the substrate;

(b) developing the photographic composition layer to thereby remove the nonimage areas thereof and leaving the image areas thereof in the form of a pattern on the substrate;

(c) overall irradiating the image areas of the layer to electron beam radiation for substantially the full depth of the layer;

(d) overall irradiating the image areas of the layer to electron beam radiation one or more additional times at a depth extending from the top surface of the layer to a depth less than the full depth of the layer; and (e) etching a surface of the substrate under the removed nonimage areas of the photographic composition layer in the absence of any additional development of the photographic composition layer after step (d) but before etching.

The invention also provides a process for producing a microelectronic device which comprises (a) coating and drying a photoresist composition layer onto a substrate;

(b) imagewise exposing the photoresist composition layer to sufficient activating energy to produce a latent pattern on the photoresist composition layer; which photoresist composition layer has a full depth extending from a top surface of the layer to the substrate;

(c) developing the photoresist composition layer to thereby remove the nonimage areas thereof and leaving the image areas thereof in the form of a pattern;

(d) overall irradiating the image areas of the layer to electron beam radiation for substantially the full depth of the layer;

(e) overall irradiating the image areas of the layer to electron beam radiation one or more additional times at a depth extending from the top surface of the layer to a depth less than the full depth of the layer; and (e) etching a surface of the substrate under the removed nonimage areas of the photographic composition layer in the absence of any additional development of the photographic composition layer after step (d) but before etching.

The invention further provides a microelectronic device which comprises a pattern of a photoresist composition layer on a substrate, which photoresist composition layer has a full depth extending from a top surface of the layer to the substrate; which layer is harder at the top surface than a balance of the depth of the layer under the top surface.

The invention still further provides a process for producing a photographic image which comprises:

(a) imagewise exposing a photographic composition layer on a substrate to sufficient activating energy to produce a latent pattern on the photographic composition layer, which photographic composition layer has a full depth extending from a top surface of the layer to the substrate;

(b) developing the photographic composition layer to thereby remove the nonimage areas thereof and leaving the image areas thereof in the form of a pattern on the substrate;

(c) overall irradiating the image areas of the layer to electron beam radiation for substantially the full depth of the layer;

(d) overall irradiating the image areas of the layer to electron beam radiation through the surface of the layer to the depth of an intermediate plane which is less than the full thickness of the layer, (e) overall irradiating the image areas of the layer to electron beam radiation one or more additional times through the surface of the layer to the depth of another plane whose depth is less than that of the prior plane; and (f) etching a surface of the substrate under the removed nonimage areas of the photographic composition layer in the absence of any additional development of the photographic composition layer after step (e) but before etching.

DETAILED DESCRIPTION OF THE PREFERRED EMBODIMENT

The first step of the process according to the invention is coating and drying a photosensitive composition onto a substrate. The photosensitive compositions useful for the invention are themselves well known in the art and are widely commercially available. Positive working photoresists include compositions or polymers that can be solubilized or degraded as a result of irradiation with an electron beam or actinic radiation. Suitable photoresist compositions may include mixtures of o-quinone diazides with an aqueous alkali soluble or swellable binder resin such as a novolak or polyhydroxystyrene such as poly(4-hydroxystyrene) or polyvinylphenol containing binder resin. Suitable photoresists are described in U.S. Pat. Nos. 4,692,398; 4,835,086; 4,863,827 and 4,892,801. Suitable photoresists may be purchased commercially as AZ-4620, from Clariant Corporation of Somerville, N.J. Other suitable photoresists include solutions of polymethylmethacrylate (PMMA), such as a liquid photoresist available as 496 k PMMA, from OLIN HUNT/OCG, West Paterson, N.J. 07424, comprising polymethylmethacrylate with molecular weight of 496,000 dissolved in chlorobenzene (9 wt %); P(MMA-MAA) (poly methyl methacrylate-methacrylic acid); PMMA/P(MMA-MAA) polymethylmethacrylate/(poly methyl methacrylate-methacrylic acid). The photoresist of the present invention may comprise any of these materials or analogous materials provided the composition can be solubilized or degraded as a result of irradiation with an electron beam or actinic radiation.

In a preferred embodiment, the positive working photoresist composition preferably comprises a solution of a novolak resin, a quinone diazide photosensitizer, and a compatible solvent composition. The production of novolak resins is well known in the art and is more fully described in U.S. Pat. No. 4,692,398. Suitable quinone diazide photosensitizers include o-quinone diazides such as naphthoquinone diazide sensitizers which are conventionally used in the art in positive photoresist formulations. Useful naphthoquinone diazide sensitizers include naphthoquinone-(1,2)-diazide-5-sulfonyl chloride, and naphtoquinone-(1,2)-diazide4-sulfonyl chloride condensed with phenolic compounds such as hydroxy benzophenones. These compounds are also more fully described in U.S. Pat. No. 4,692,398.

To produce this preferred photoresist composition, the resin and diazide components are first mixed together with a suitable solvent. The resin component of this mixture is present in an amount of from about 15% to about 99% of the solid parts mixture, and the quinone is present in an amount of from about 1% to about 85% of the solid parts of the mixture. This resin/diazide mixture is then mixed with a solvent composition. The solvent composition may comprise any suitable solvent known in the art. Preferred solvents include propylene glycol monomethylether, propylene glycol monomethylether acetate, xylene, butyl acetate and cellosolve acetate such that the solvent comprises from about 40% to about 90% by weight of the overall resist composition. Conventional photoresist additives such as dyes, anti-striation agents, plasticizers, adhesion promoters, speed enhancers and non-ionic surfactants may optionally be added to the photoresist composition before it is deposited onto the substrate.

Another preferred positive working photoresist composition preferably comprises an acrylic polymer such as polymethyl methacrylate (PMMA) and those mentioned above. Polymethyl methacrylate is an acrylic polymer which is extensively used in the industry. Polymethyl methacrylate is known for its clarity, surface hardness, UV resistance and generally good weatherability and chemical resistance. PMMA is commonly used as component of a resist in photolithographic processes for the fabrication of integrated circuits. PMMA is readily commercially available from Aldrich Chemical Company of Milwaukee, Wis.

Another preferred photoresist is composed of a mixture of a water insoluble, acid decomposable polymer which is substantially transparent to ultraviolet radiation at a wavelength of about 193 nm, a photosensitive compound capable of generating an acid upon exposure to sufficient activating energy at a wavelength of about 193 nm, and optional other ingredients. Acid decomposable polymers suitable for a chemical amplification resist film for ArF laser exposure which are substantially transparent at 193 nm are well known in the art and nonexclusively include cyclic olefins, and acrylics and methacrylates such as polyalkylacrylates and polyalkylmethacrylates, norbomene containing polymers, and alicyclic polymers. Cyclic olefin materials offer superior etch resistance, surpassing even that of novolac materials. The most widely employed route involves free radical copolymerization of maleic anhydride with a cyclic olefin monomer. The maleic anhydride serves as an oxygen-rich polar unit whose hydrophilic nature offsets the hydrophobic nature of the cyclic olefin monomer. Others polymers include polymethylacrylate and polymethylmethacrylate (PMMA) as well as copolymers thereof and polymers which have a backbone of polymethylmethacrylate having pendant groups which do not substantially reduce the transparency of the polymer at 193 nm. PMMA has a particularly high transmittance to the light of 193 nm wavelength and it is known for its clarity, surface hardness, UV transparency and chemical resistance. PMMA is readily commercially available from Aldrich Chemical Company of Milwaukee, Wis. Preferably the polymer has a molecular weight in the range of from about 1,000 to about 800,000. Alicyclic polymers include acrylatelalicyclic polymers such as hybrid polymers produced by the free radical copolymerization of norbornene, maleic anhydride and either acrylic acid or t-butyl acrylate. A terpolymer of acrylonitrile, tertiary-butyl methacrylate and methacrylic acid has also been shown to have high transparency at 193 nm and excellent dry etch resistance.

Useful photosensitive compounds capable of generating an acid upon exposure to sufficient activating energy at a wavelength of about 193 nm include onium salts such as sulfonium, diazonium and iodonium salts. Sulfonium salts are described in U.S. Pat. No. 4,537,854; diazonium salts are described in Light Sensitive Systems, Kosar, J.; John Wiley & Sons, New York, 1965. Iodonium salts are described in U.S. Pat. No. 4,603,101. The light sensitive composition may be formed by admixing the ingredients in a suitable solvent composition. In the preferred embodiment the polymer is preferably present in the overall composition in an amount of from about 50% to about 99% based on the weight of the solid, i.e. non-solvent parts of the composition. A more preferred range of copolymer would be from about 80% to about 99% and most preferably from about 82% to about 95% by weight of the solid composition parts. The photosensitive compound is preferably present in an amount ranging from about 1% to about 20% based on the weight of the solid, i.e., non-solvent parts of the composition. A more preferred range of the photosensitive compound would be from about 5% to about 20% by weight of the solid composition parts. In preparing the composition, the polymer and photosensitive compound are mixed with a sufficient amount of a solvent composition to form a uniform solution. Such solvents include propylene glycol alkyl ether acetate, butyl acetate, ethylene glycol monoethyl ether acetate, diglyme, cyclopentanone and propylene glycol methyl ether acetate, among others. The composition may additionally contain additives such as colorants, dyes, anti-striation agents, leveling agents, crosslinkers, plasticizers, adhesion promoters, speed enhancers, solvents, acid generators, dissolution inhibitors and non-ionic surfactants.

Examples of dye additives that may be used together with the photoresist compositions of the present invention include Methyl Violet 2B (C.I. No. 42535), Crystal Violet (C.I. 42555), Malachite Green (C.I. No. 42000), Victoria Blue B (C.I. No. 44045) and Neutral Red (C.I. No. 50040) in an amount of from about 1.0 to about 10.0 percent, based on the combined weight of the solid parts of the composition. The dye additives help provide increased resolution by inhibiting back scattering of light off the substrate. Anti-striation agents may be used up to five percent weight level, based on the combined weight of solids. Adhesion promoters which may be used include, for example, beta-(3,4-epoxy-cyclohexyl)-ethyltrimethoxysilane; p-methyl-disilane-methyl methacrylate; vinyltrichlorosilane; and gamma-amino-propyl triethoxysilane up to a 4.0 percent based on the combined weight of solids. Speed enhancers that may be used include, for example, picric acid, nicotinic acid or nitrocinnamic acid at up to 20 percent, based on the combined weight of copolymer and solids. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhancers will also cause a larger loss of photoresist coating from the unexposed areas. Non-ionic surfactants that may be used include, for example, nonylphenoxy poly (ethyleneoxy)ethanol; octylphenoxy(ethyleneoxy)ethanol; and dinonyl phenoxy poly(ethyleneoxy)ethanol at up to 10 percent based on the combined weight of solids.

Photoresists which are photosensitive at 193 nm are well known in the art and widely commercially available, Such include K98 and D3 available from the Shipley Company; 620-10 from Olin Microelectronics Materials, AM01, AM02 and AM03 from Japan Synthetic Rubber Company, TOK-TArF-5A-1 and TOK-TArF-6A-1 from Tokyo Ohka Kogyo Co. Ltd, DUV-18L from Brewer Science. Other suitable photoresists include solutions of polymethylmethacrylate (PMMA), such as a liquid photoresist available as 496 k PMMA, from OLIN HUNT/OCG, West Paterson, N.J. 07424, comprising polymethylmethacrylate with molecular weight of 496,000 dissolved in chlorobenzene (9 wt %); P(MMA-MAA) (poly methyl methacrylate-methacrylic acid); PMMA/P(MMA-MAA) polymethylmethacrylate/ (poly methyl methacrylate-methacrylic acid).

In the production of the microelectronic device of the present invention, one coats and dries the foregoing photosensitive composition on a suitable substrate. Suitable substrates nonexclusively include silicon, aluminum, lithium niobate, polymeric resins, silicon dioxide, doped silicon dioxide, gallium arsenide, Group III/V compounds, silicon nitride, tantalum, copper, polysilicon, ceramics and aluminum/copper mixtures. Semiconductor substrates are most preferred. Lines may optionally be on the substrate surface. The lines, when present, are typically formed by well known lithographic techniques and may be composed of a metal, an oxide, a nitride or an oxynitride. Suitable materials for the lines include silica, silicon nitride, titanium nitride, tantalum nitride, aluminum, aluminum alloys, copper, copper alloys, tantalum, tungsten and silicon oxynitride. These lines form the conductors or insulators of an integrated circuit. Such are typically closely separated from one another at distances preferably of from about 20 micrometers or less, more preferably from about 1 micrometer or less, and most preferably of from about 0.05 to about 1 micrometer.

The prepared resist solution can be applied to a substrate by any conventional method used in the photoresist art, including dipping, spraying, whirling and spin coating. When spin coating, for example, the resist solution can be adjusted as to the percentage of solids content in order to provide coating of the desired thickness given the type of spinning equipment utilized and the amount of time allowed for the spinning process. In a preferred embodiment of the invention, the photoresist layer is formed by centrally applying a liquid photoresist composition to the upper surface on a rotating wheel at speeds ranging from about 500 to about 6000 rpm, preferably from about 1500 to about 4000 rpm, for about 5 to about 60 seconds, preferably from about 10 to about 30 seconds, in order to spread the composition evenly across the upper surface. The thickness of the photoresist layer may vary depending on the amount of liquid photoresist composition that is applied and the spin speed chosen, but typically the thickness may range from about 500 Å to about 50,000 Å, and preferably from about 2000 Å to about 12000 Å. The amount of photoresist composition which is applied may vary from about 1 ml to about 10 ml, and preferably from about 2 ml to about 8 ml depending on the size of the substrate.

After the resist composition solution is coated onto the substrate, the substrate is temperature treated at approximately 20° C. to 200° C. This temperature treatment is done in order to reduce and control the concentration of residual solvents in the photoresist while not causing substantial thermal degradation of the photosensitizer. In general one desires to minimize the concentration of solvents and thus this temperature treatment is conducted until substantially all of the solvents have evaporated and a thin coating of photoresist composition, on the order of a micron in thickness, remains on the substrate. In a preferred embodiment the temperature is conducted at from about 50° C. to about 150° C. A more preferred range is from about 70° C. to about 90° C. This treatment is conducted until the rate of change of solvent removal becomes relatively insignificant. The temperature and time selection depends on the resist properties desired by the user as well as equipment used and commercially desired coating times. Commercially acceptable treatment times for hot plate treatment are those up to about 3 minutes, more preferably up to about 1 minute. In one example, a 30 second treatment at 90° C. is useful. Treatment times increase to about 20 to about 40 minutes when conducted in a convection oven at these temperatures.

The photoresist layer is then imagewise exposed to actinic radiation and developed to form a plurality of cavities through the photoresist thus defining photoresist features and thereby revealing portions of the substrate to be patterned. Imagewise exposure may be to ultraviolet radiation through a suitable patterned mask or by laser exposure such as via an ArF laser. This exposure renders the photoresist layer more soluble after exposure than prior to exposure. When such a chemical amplification resist is exposed to light, activated acid induces a catalytic chain reaction to a photoresist film organic polymer, generating a significant amount of protons. In the resist, protons bring a large change into the solubility of the resin. When the photoresist film is irradiated by a high energy beam, e.g. 193 nm, acid ($H^+$) is generated, reacting with the polymer. Acid is again generated and reacts with unreacted polymer. The polymer is then dissolved in a developing solution. In contrast, the polymer at the non-exposed region maintains its structure which is insoluble to the developing solution. With such a mechanism, a goocl profile pattern can be made on a wafer substrate. The amount of actinic radiation used is an amount sufficient to render the exposed portions of the photoresist layer imagewise soluble in a suitable developer. Preferably, UV radiation is used in an amount sufficient to render the exposed portions of the photoresist layer imagewise soluble is a suitable developer. Actinic radiation such as UV (ultraviolet), laser, writing e-beam, x radiation, etc., may be employed in the present invention. Preferably, UV radiation is used in an amount and at a wavelength sufficient to render the exposed portions of the photoresist layer imagewise soluble is a suitable developer. UV exposure doses preferably range from about 5 $mJ/cm^2$ to about 300 $mJ/cm^2$, more preferably from about 5 $mJ/cm^2$ to about 100 $mJ/cm^2$ and still more preferably from about 10 $mJ/cm^2$ to about 30 $mJ/cm^2$. The preferred imagewise exposing is conducted with activating energy at a wavelength of about 157 nm, about 193 nm, about 248 nm, about 365 nm or about 435 nm. Exposure is preferably via an ArF laser, i.e. at a wavelength of from about 193 nm. When an ArF laser is used for exposure, exposure doses preferably ranges from about 1 $mJ/cm^2$ to about 10 $mJ/cm^2$, more preferably from about 2 $mJ/cm^2$ to about 8 $mJ/cm^2$. Preferably the process further comprises the step of heating the imagewise exposed photosensitive composition prior to developing, such as by baking, for a sufficient time and temperature to increase the rate at which the acid decomposes the polymer in the imagewise exposed areas of the photosensitive composition. This drives the acid reaction for better image formation. Such a heat treatment may be conducted at temperatures of from about 50° C. to about 150° C., preferably from about 120° C. to about 150° C. for from about 30 seconds to about 2 minutes.

The non-image areas of the photoresist are then removed by development while leaving the image areas on the substrate. The development step may be conducted by immersion in a suitable developing solution. The solution is preferably agitated, for example, by nitrogen burst agitation. The substrates are allowed to remain in the developer until all, or substantially all of the resist coating has dissolved from the irradiated areas. Typical examples of the aqueous alkaline solutions suitable as the developer include sodium hydroxide, tetramethylammonium hydroxide, or aqueous solutions of hydroxides of metals belonging to the Groups I and II of the periodic table such as potassium hydroxide. Aqueous solution of organic bases free from metal ions such as tetraalkylammonium hydroxide, for example, tetramethylammonium hydroxide (TMAH), tetraethylammonium hydroxide (TEAH) and tetrabutylammonium hydroxide (TBAH). More preferably, tetramethylammonium hydroxide (TMAH) is preferred. Furthermore, if desired, the aqueous basic solution used as the developer may additionally contain any additives such as a surface active agent in order to improve the resulting development effect. Examples of an aqueous alkaline developer include AZ 400K alkaline developer or AZ 312 MIF alkaline developer available from Clariant Corporation of Somerville, N.J. Suitable developer for acrylate photoresists such as PMMA photoresists include methylisobutyl ketone and xylene. After removal of the coated wafers from the developing solution, an optional, although not required, post-development heat treatment or bake may be employed to increase the adhesion of the coating as well as resistance to etching solutions and other substances. The post-development heat treatment can comprise the oven baking of the coating and substrate below the coating's softening point.

The remaining photoresist layer is then overall irradiated to sufficient electron beam radiation for substantially the full depth of the layer. Electron beam exposure may be controlled by setting the beam acceleration. The electron beam is controlled such that the electrons reach all the way down to the substrate.

The electron beam irradiating is conducted with a uniform, large-area, overall electron beam exposure source which simultaneously exposes substantially all of the image areas of the photosensitive composition simultaneously. Electron beam radiation may take place in any chamber having a means for providing electron beam radiation to substrates placed therein. It is preferred that the electron beam exposing step is conducted with a wide, large beam of electron radiation from a large-area electron beam source. Preferably, an electron beam chamber is used which provides a large area electron source. Suitable electron beam chambers are commercially available from Electron Vision, a unit of Honeywell International Inc., under the trade name "ElectronCure™". The principles of operation and performance characteristics of such a device are described in U.S. Pat. No. 5,003,178, the disclosure of which is incorporated herein by reference. The temperature of the electron beam exposure preferably ranges from about 20° C. to about 450° C., more preferably from about 50° C. to about 400° C. The electron beam energy is preferably from about 0.5 to about 30 KeV, and more preferably from about 1 to about 12 KeV and most preferably from about 5 to about 9 KeV. The dose of electrons is from about 1 to about 500,000 $\mu C/cm^2$, preferably from about 50 to about 50,000 $\mu C/cm^2$ and more preferably from about 50 to about 5,000 $\mu C/cm^2$. The gas ambient in the electron beam tool can be any of the following gases: nitrogen, oxygen, hydrogen, argon, xenon, helium, ammonia, silane, a blend of hydrogen and nitrogen, ammonia or any combination of these gases. The electron beam current is preferably from about 1 to about 150 mA, and more preferably from about 1 to about 20 mA. The electron beam irradiating is conducted while the substrate is under a vacuum maintained in the range of from about $10^{-5}$ to about $10^2$ torr. Preferably the exposure is conducted under a soft vacuum of about 10 to about 80 milliTorr. Preferably, the electron beam exposing step is conducted with a wide, large-area beam of electron beam radiation from a uniform large-area electron beam source which simultaneously covers the entire substrate area, i.e. an area of from about 4 inches to about 256 square inches.

Next, the photoresist image is overall irradiated to electron beam radiation one or more additional times at a depth extending from the top surface of the layer to a depth less than the full depth of the layer. In the preferred case, irradiation is done through the surface of the photoresist layer to an intermediate plane which is less than the full thickness of the resist layer. Then another irradiation is done through the surface of the resist layer to another plane whose depth is less than the prior intermediate plane. This may then be repeated through the surface of the resist layer to yet another plane whose depth is less than the prior intermediate plane. This is done by dynamically varying the accelerating potential of the electron beam without removing the imaged substrate from the exposure tool. Each additional overall irradiating is conducted under the conditions described above at a depth of from about 10% to about 50% of the full depth of the layer extending from the top surface of the layer. The particular dose and depth can be performed according to the type of resist used and the result desired by the skilled artisan. Preferably each additional overall irradiating is conducted at a depth of from about 25% to about 50% of the full depth of the layer. More preferably each additional overall irradiating is conducted at a depth of from about 25% to about 35% of the full depth of the layer. In a preferred procedure, three additional overall irradiating steps are conducted at a depth of about 10%, about 25% and about 50% of the full depth of the layer. Preferably, although not necessarily, the additional doses are lower than the first dose. By applying a low electron beam dose first, i.e. in the range of from about 1 to about 200 $\mu C/cm^2$ at high energy for the full film thickness, followed by a series of exposures starting with a low accelerating potential of about 0.5 to about 4 keV at moderate dose, i.e. from about 200 $\mu C/cm^2$ to about 1000 $\mu C/cm^2$ such that at an energy (E) of $E_1>E_4>E_3>E_2$ for a four step sequence, a reduction in resist shrinkage is achieved relative to a single step exposure with a total dose equal to the sum of the multi-step exposure.

The result of this multi-irradiating process is to render the patterned image more resistant to an etchant. In general, the multi-step distribution of doses allows a reduction in the total dose necessary to achieve a given level of thermal stability since it is not necessary to fully expose the entire thickness of the layer. Thermal stability can be measured by glass transition temperature Tg or the flow stability of the patterned resist. The multi-step distribution of electron bean irradiation dose can be optimized according to the requirements of varying etch processes. By adjusting the combinations of electron energy and dose at each energy level the shrinkage, both lateral and vertical, can be reduced relative to a single irradiation step or thermal treatments or alternate stabilization processes.

After the "surface hardening" e-beam treatment, the patterned resist features are subjected to a dry plasma etch. It is an important feature of the invention that no additional photoresist developing step be conducted after the e-beam treatments but before substrate surface etching. Such would result in an undercutting of the photoresist which is unwanted for this invention. Etching is conventionally done with a commercial plasma etch system, of which there are several varieties. A plasma etch tool comprises an etch chamber, a pumping system, pressure gauges, an rf source, gas delivery components, and electrodes.

The following are examples of etch systems that are commonly used in the industry. (1) A "barrel" etcher is a cylindrically shaped chamber with the electrodes at the top and bottom of the vessel; a "batch" of samples occupies the volume between the electrodes. (2) A "hexode" etcher also has a cylindrically shaped chamber, but the electrodes are the hexagonal inner structure (the hexode) and the chamber outer wall. (3) A parallel-plate etcher has electrodes which are circular and flat and approximately the size of the wafers for which it is designed. The first two etchers are "batch" etchers, which can etch multiple wafers at the same time, while the third etcher is a single-wafer etcher and is the standard etcher type used today. Examples of commercially available single-wafer etch systems are the Precision 5000 MxP+ made by Applied Materials and the Rainbow made by Lam Research Corp.

In all etcher designs, the etch chamber houses the sample (s) and is evacuated to sub-atmospheric pressures, for example about 200 mTorr. The gas delivery components (e.g., mass flow controllers) maintain a controlled flow of process gases (e.g., 100–200 sccm) into the chamber. The electrodes and rf supply are essential to creating and maintaining a plasma inside the etch chamber. Typical rf supplies operate at 13.56 MHz and a typical power of 500–1000 W. In most etchers, energetic ion bombardment comprises the physical etching aspect, and the reactivity of the etchant gases comprises the chemical etching aspect of the process. The gases used depend upon the material to be etched. The three materials commonly etched in the semiconductor industry are aluminum, silicon, and silicon dioxide. Metal, poly, oxide and polymer etchants include chlorine, bromine, fluorine and oxygen plasma etchants. The etchants used for etching aluminum are usually boron trichloride ($BCl_3$) and chlorine ($Cl_2$); the etchants used for etching silicon are usually fluorine- and chlorine-based (e.g., $SF_6$ and $Cl_2$); and the etchants used for etching silicon dioxide are fluorine-based (e.g., $CHF_3$ and $CF_4$). Typical etch times range from about 30 seconds to about 90 seconds, but etch times can be as long as 5 minutes or more. Etch times can be set by those skilled in the art or by use of a fluorescence-based endpoint detector.

The following non-limiting examples serve to illustrate the invention.

EXAMPLE 1

A set of 100 mm Silicon wafers are prepared for coating by applying an acid based cleaner to remove native oxide and contaminants from the surface. A layer of CVD oxide is deposited on the wafers. A stack of TiN, Al, and TiN is then deposited on the wafers. A layer of a 365 nm photoresist (Shipley Company SPR 3012) was spin-coated onto the silicon wafers. The resist is spin coated and baked according to the manufacturer's recommended process.

The photoresist is then patterned using a Ultra-Tech Stepper exposure system at 365 nm. The exposed areas are removed by development in an aqueous base developer. After developing, the patterns were inspected for Critical Dimensions (CDs). The films were then measured using a Profilometer to get an accurate measurement of the resist thickness after developing. The average resist film thickness for the group of wafers was 2.1 $\mu$m.

The wafers were then subjected to an electron beam irradiation treatment in the ElectronCure™ tool made by the Electron Vision Group of Honeywell International Inc. A uniform dose distribution recipe was employed and doses ranged from 500 to 4,000 $\mu C/cm^2$. The uniform dose recipes were broken up into three different groups to effectively deposit the electron beam dose at different levels in the resist film. These dose distributions are listed below as the Standard Process, the Modified Process and the Inverted Process. The Standard process has the largest dose percentage applied at the highest voltage. The Modified process has the dose more uniformly distributed between the four steps inverted process has the dose levels inverted as compared to the modified process.

| | | Total dose ($\mu C/cm^2$) | | | |
|---|---|---|---|---|---|
| Step | keV | 500 | 1000 | 2000 | 4000 |
| Uniform Dose/Depth Process A: Standard Process | | | | | |
| 1 | 12 | 325 | 650 | 1300 | 2600 |
| 2 | 8 | 75 | 150 | 300 | 600 |
| 3 | 5 | 50 | 100 | 200 | 400 |
| 4 | 3 | 50 | 100 | 200 | 400 |
| Uniform dose/Depth Process B: Modified Process | | | | | |
| 1 | 12 | 200 | 400 | 800 | 1600 |
| 2 | 8 | 100 | 200 | 400 | 800 |
| 3 | 5 | 100 | 200 | 400 | 800 |
| 4 | 3 | 100 | 200 | 400 | 800 |
| Uniform dose/Depth Process C: Inverted Process | | | | | |
| 1 | 12 | 100 | 200 | 400 | 800 |
| 2 | 8 | 100 | 200 | 400 | 800 |
| 3 | 5 | 100 | 200 | 400 | 800 |
| 4 | 3 | 200 | 400 | 800 | 1600 |

The photoresist patterns were then measured after electron beam processing, using the profilometer, to determine the remaining film thickness. The photoresist films were then etched for 60 seconds in a plasma etching tool using a standard aluminum etch chemistry ($BCl_3/Cl_2$). This etch time was used to etch though only part of the metal stack underlying the resist patterns. After etching, the resist plus metal height was measured using the profilometer. The resist was then removed using a standard resist removal process. Finally the metal step height was measured using the profilometer.

The selectivity for the process was used as the measure for the effectiveness of the different dose distributions to improve the plasma etch resistance of the resist. The selectivity is defined at the etch rate of the resist to the etch rate of the metal. Thus, the slower the resist etches, at a fixed metal etch rate, the better the plasma etch resistance of the resist and the higher the selectivity. The selectivity is calculated from the profilometer measurements taken at the different points in the process flow.

The selectivities for the different processes are shown in the table below. There is an increase in selectivity with increasing electron beam dose for all cases. There is also a difference in selectivity at a given dose based on the dose distribution process considered. For processes B and C there is a slightly higher selectivity at each dose as compared to process A.

Thus, it is suggested that the plasma etch resistance of the photoresist can be modified by the electron beam process. The level of this modification, and its impact on the process results are functions of the total dose and the dose distribution considered.

TABLE 1

Etch Selectivity vs. Dose and Process

| E-beam dose ($\mu c/cm^2$) | Process A | Process B | Process C |
|---|---|---|---|
| | (Selectivity: Resist/Metal) | | |
| 500 | 2.1 | 2.4 | 2.4 |
| 1000 | 2.7 | 2.6 | 2.8 |
| 2000 | 2.9 | 3.2 | 3.3 |
| 4000 | 3.7 | 3.9 | 3.9 |

EXAMPLE 2

A layer of 193 nm photoresist is spin-coated onto an 8" silicon wafer. The photoresist layer may be on top of another deposited layer (e.g., metal, poly-Si, or oxide) or directly on the silicon substrate. After the softbake, the 193 nm resist thickness is ~6000 Å.

The photoresist layer is then lithographically exposed using a 193 nm stepper system, such as the ASML PAS 5500/950. Such an exposure system is capable of resolving geometries as small as 150 nm with moderate reticle enhancements. After resist development, the reticle features are transferred to the 193 nm resist.

A flood electron beam exposure treatment is applied to the developed features. This electron beam treatment provides an enhancement in etch profile, etch selectivity and mechanical stability in 193 nm photoresist. A total dose of 2000 $\mu C/cm^2$ is delivered to the developed resist in a non-uniform distribution. This is done instead of the uniform distribution because 193 nm resists have exhibited large film thickness shrinkage after an electron beam treatment. The following dose recipe targets the largest dose towards a thickness of 2000 Å, or 33% of the total thickness in this case. For reference, the standard uniform dose recipe targets the largest dose towards the full film thickness.

| Step | Voltage (kV) | Dose |
|---|---|---|
| 1 | 6.27 | 700 |
| 2 | 4.05 | 1000 |
| 3 | 3.30 | 225 |
| 4 | 2.75 | 75 |

The following table shows the total thickness loss after plasma etch. The total thickness loss denotes the thickness loss due to e-beam cure plus the thickness loss due to plasma etch. A total thickness loss as small as possible is desired.

| Cure condition | Total thickness loss (Å) |
|---|---|
| No cure | 3465 |
| Uniform dose | 3366 |
| Surface cure | 3253 |

From the above it can be seen that with certain surface cure conditions, the non-uniform dose distribution is beneficial in minimizing the resist thickness loss.

While the present invention has been particularly shown and described with reference to preferred embodiments, it will be readily appreciated by those of ordinary skill in the art that various changes and modifications may be made without departing from the spirit and scope of the invention. It is intended that the claims be interpreted to cover the disclosed embodiment, those alternatives which have discussed above, and all equivalents thereto.

What is claimed is:

1. A process for producing a photographic image which comprises:
    (a) imagewise exposing a photographic composition layer on a substrate to sufficient activating energy to produce a latent pattern on the photographic composition layer; which photographic composition layer has a full depth extending from a top surface of the layer to the substrate;
    (b) developing the photographic composition layer to thereby remove the nonimage areas thereof and leaving the image areas thereof in the form of a pattern on the substrate;
    (c) overall irradiating the image areas of the layer to electron beam radiation for substantially the full depth of the layer;
    (d) overall irradiating the image areas of the layer to electron beam radiation one or more additional times at a depth extending from the top surface of the layer to a depth less than the full depth of the layer; and
    (e) etching a surface of the substrate under the removed nonimage areas of the photographic composition layer in the absence of any additional development of the photographic composition layer after step (d) but before etching.

2. The process of claim 1 wherein each additional overall irradiating (d) is conducted at a depth of from about 10% to about 50% of the full depth of the layer extending from the top surface of the layer.

3. The process of claim 1 wherein each additional overall irradiating (d) is conducted at a depth of from about 25% to about 50% of the full depth of the layer extending from the top surface of the layer.

4. The process of claim 1 wherein each additional overall irradiating (d) is conducted at a depth of from about 25% to about 35% of the full depth of the layer extending from the top surface of the layer.

5. The process of claim 1 wherein three additional overall irradiating steps (d) are conducted at a depth of about 10%, about 25% and about 50% of the full depth of the layer extending from the top surface of the layer.

6. The process of claim 1 wherein the photographic composition comprises a photoresist composition.

7. The process of claim 1 wherein the imagewise exposing is conducted with activating energy at a wavelength of about 157 nm, about 193 nm, about 248 nm, about 365 nm or about 435 nm.

8. The process of claim 1 wherein the photosensitive composition comprises
(i) at least one water insoluble, acid decomposable polymer, wherein said polymer is present in the photosensitive composition in an amount sufficient to form a uniform film of the composition components when it is coated on a substrate and dried;
(ii) at least one photosensitive compound capable of generating an acid upon exposure to sufficient activating energy, said photosensitive compound being present in an amount sufficient to substantially uniformly photosensitive the photosensitive composition.

9. The process of claim 8 wherein the polymer is substantially transparent to ultraviolet radiation at a wavelength of about 193 nm; the photosensitive compound is capable of generating an acid upon exposure to sufficient activating energy at a wavelength of about 193 nm and the imagewise exposing is conducted at a wavelength of about 193 nm.

10. The process of claim 8 wherein the polymer is substantially transparent to ultraviolet radiation at a wavelength of about 157 nm, about 248 nm, about 365 nm or about 435 nm; the photosensitive compound is capable of generating an acid upon exposure to sufficient activating energy at a wavelength of about 157 nm, about 248 nm, about 365 nm or about 435 nm and the imagewise exposing is conducted at a wavelength of about 157 nm, about 248 nm, about 365 nm or about 435 nm.

11. The process of claim 8 wherein the polymer comprises a cyclic olefin, an acrylate, a methacrylate, an acrylate with a pendant alicyclic group, a norbornene containing polymer, an alicyclic polymer or combinations thereof.

12. The process of claim 8 wherein the polymer comprises a polyalkylacrylate or a polyalkylmethacrylate.

13. The process of claim 8 wherein the photosensitive compound comprises a sulfonium, iodonium or diazonium compound.

14. The process of claim 1 wherein the photosensitive composition comprises a combination of an o-quinone diazide and at least one water insoluble, aqueous alkaline soluble or swellable binder resin.

15. The process of claim 1 wherein the photosensitive composition comprises a combination of an o-quinone diazide and at least one novolak, polyhydroxystyrene or polyvinylphenol containing binder resin.

16. The process of claim 1 wherein the substrate is selected from the group consisting of silicon, aluminum, lithium niobate, polymeric resins, silicon dioxide, doped silicon dioxide, gallium arsenide, Group III/V compounds, oxides, silicon nitride, titanium, titanium nitride, tantalum, tantalum nitride, copper, polysilicon, ceramics, aluminum/copper mixtures and combinations thereof.

17. The process of claim 1 wherein each electron beam irradiating is conducted with a uniform, large-area, overall electron beam exposure source which simultaneously exposes substantially all of the image areas of the photosensitive composition simultaneously.

18. The process of claim 1 wherein each electron beam irradiating is conducted with a uniform large-area electron beam source which covers an exposure area of from about 4 square inches to about 256 square inches simultaneously.

19. The process of claim 1 wherein each electron beam irradiating is conducted with a source which generates an electron beam energy level ranging from about 0.5 to about 30 KeV.

20. The process of claim 1 wherein each electron beam irradiating is from a source which generates an electron dose ranging from about 1 to about 500,000 $\mu C/cm^2$.

21. The process of claim 1 wherein each electron beam irradiating is conducted from a source which generates an electron beam current of from about 1 to about 150 mA.

22. The process of claim 1 wherein each electron beam irradiating is conducted while heating the substrate to a temperature of from about 20° C. to about 450° C.

23. The process of claim 1 wherein each electron beam irradiating is conducted in a gas selected from the group consisting of nitrogen, oxygen, hydrogen, argon, xenon, helium, ammonia, silane, a blend of hydrogen and nitrogen, ammonia and mixtures thereof.

24. The process of claim 1 wherein each electron beam irradiating is conducted while the substrate is under a vacuum maintained in the range of from about $10^{-5}$ to about $10^2$ torr.

25. The process of claim 1 further comprising the step of heating the imagewise exposed photosensitive composition prior to developing.

26. The process of claim 1 wherein the developing is conducted with an aqueous alkaline solution.

27. A process for producing a microelectronic device which comprises
(a) coating and drying a photoresist composition layer onto a substrate;
(b) imagewise exposing the photoresist composition layer to sufficient activating energy to produce a latent pattern on the photoresist composition layer, which photoresist composition layer has a full depth extending from a top surface of the layer to the substrate;
(c) developing the photoresist composition layer to thereby remove the nonimage areas thereof and leaving the image areas thereof in the form of a pattern;
(d) overall irradiating the image areas of the layer to electron beam radiation for substantially the full depth of the layer; and
(e) overall irradiating the image areas of the layer to electron beam radiation one or more additional times at a depth extending from the top surface of the layer to a depth less than the full depth of the layer; and
(e) etching a surface of the substrate under the removed nonimage areas of the photographic composition layer in the absence of any additional development of the photographic composition layer after step (d) but before etching.

28. A process for producing a photographic image which comprises:
(a) imagewise exposing a photographic composition layer on a substrate to sufficient activating energy to produce a latent pattern on the photographic composition layer; which photographic composition layer has a full depth extending from a top surface of the layer to the substrate;
(b) developing the photographic composition layer to thereby remove the nonimage areas thereof and leaving the image areas thereof in the form of a pattern on the substrate;
(c) overall irradiating the image areas of the layer to electron beam radiation for substantially the full depth of the layer;
(d) overall irradiating the image areas of the layer to electron beam radiation through the surface of the layer to the depth of an intermediate plane which is less than the full thickness of the layer;
(e) overall irradiating the image areas of the layer to electron beam radiation one or more additional times through the surface of the layer to the depth of another plane whose depth is less than that of the prior plane; and (f) etching a surface of the substrate under the removed nonimage areas of the photographic composition layer in the absence of any additional development of the photographic composition layer after step (e) but before etching.

* * * * *